(12) United States Patent
Yamamoto et al.

(10) Patent No.: US 10,577,524 B2
(45) Date of Patent: Mar. 3, 2020

(54) CONDUCTIVE ADHESIVE COMPOSITION

(71) Applicant: TATSUTA ELECTRIC WIRE & CABLE CO., LTD., Higashiosaka-shi, Osaka (JP)

(72) Inventors: Yoshihisa Yamamoto, Kizugawa (JP); Shigekazu Umemura, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 15/780,611

(22) PCT Filed: May 23, 2017

(86) PCT No.: PCT/JP2017/019210
§ 371 (c)(1),
(2) Date: May 31, 2018

(87) PCT Pub. No.: WO2017/204218
PCT Pub. Date: Nov. 30, 2017

(65) Prior Publication Data
US 2019/0106607 A1 Apr. 11, 2019

(30) Foreign Application Priority Data
May 23, 2016 (JP) .................. 2016-102563

(51) Int. Cl.
*C09J 9/02* (2006.01)
*H01B 1/20* (2006.01)
(Continued)

(52) U.S. Cl.
CPC ............... *C09J 9/02* (2013.01); *C08G 18/42* (2013.01); *C08G 18/4263* (2013.01);
(Continued)

(58) Field of Classification Search
CPC .......................................................... C09J 9/02
See application file for complete search history.

(56) References Cited

U.S. PATENT DOCUMENTS

2003/0201427 A1  10/2003  Hori et al.
2007/0287095 A1* 12/2007  Endo ............... B41C 1/1016
                                                430/270.1
(Continued)

FOREIGN PATENT DOCUMENTS

CN  101940080 A  1/2011
JP  2001131527 A  5/2001
(Continued)

OTHER PUBLICATIONS

DKSH, Performance Materials—Daimicbeaz, elastic polyurethan powders. Retrieved on Feb. 13, 2019. https://www.in-cosmetics.com/_novadocuments/2368 (Year: 2019).*

*Primary Examiner* — Megan McCulley
(74) *Attorney, Agent, or Firm* — Potomoac Law Group, PLLC; Kenneth Fagin

(57) ABSTRACT

Provided herein is a conductive adhesive composition containing: a thermosetting resin having a functional group reactive with an epoxy group; an epoxy resin; a conductive filler; and urethane resin particles having a mean particle diameter of 4 μm or more and 13 μm or less and a hardness of 55 or more and 90 or less measured by a type A durometer in conformity with JIS K6253.

6 Claims, 3 Drawing Sheets

(51) Int. Cl.
  *H05K 1/02* (2006.01)
  *C08G 59/68* (2006.01)
  *C08G 18/44* (2006.01)
  *C08G 18/73* (2006.01)
  *C08G 18/80* (2006.01)
  *C08G 59/40* (2006.01)
  *C08G 18/75* (2006.01)
  *C08G 18/42* (2006.01)
  *C09J 7/10* (2018.01)
  *C08G 18/48* (2006.01)
  *C08G 18/76* (2006.01)
  *C09J 11/04* (2006.01)
  *C09J 175/04* (2006.01)
  *C09J 7/25* (2018.01)
  *C09J 7/30* (2018.01)
  *H05K 9/00* (2006.01)

(52) U.S. Cl.
  CPC ............ *C08G 18/44* (2013.01); *C08G 18/48* (2013.01); *C08G 18/73* (2013.01); *C08G 18/75* (2013.01); *C08G 18/76* (2013.01); *C08G 18/80* (2013.01); *C08G 59/4028* (2013.01); *C08G 59/686* (2013.01); *C09J 7/10* (2018.01); *C09J 7/255* (2018.01); *C09J 7/30* (2018.01); *C09J 11/04* (2013.01); *C09J 175/04* (2013.01); *H01B 1/20* (2013.01); *H05K 1/02* (2013.01); *H05K 1/0216* (2013.01); *H05K 1/0271* (2013.01); *H05K 9/0083* (2013.01); *C09J 2201/61* (2013.01); *C09J 2203/326* (2013.01); *C09J 2463/00* (2013.01); *C09J 2467/006* (2013.01); *C09J 2475/00* (2013.01); *H05K 2201/10371* (2013.01)

(56) References Cited

U.S. PATENT DOCUMENTS

| | | | | |
|---|---|---|---|---|
| 2008/0113296 | A1* | 5/2008 | Yamamoto | B41C 1/1016 430/280.1 |
| 2010/0104879 | A1* | 4/2010 | Okano | G02B 1/105 428/447 |
| 2013/0012108 | A1* | 1/2013 | Li | B24D 3/28 451/59 |
| 2013/0302070 | A1* | 11/2013 | Oosaku | G03G 15/0808 399/286 |
| 2014/0048314 | A1* | 2/2014 | Kido | H05K 1/0281 174/254 |
| 2014/0054081 | A1* | 2/2014 | Kido | H05K 1/0218 174/350 |
| 2015/0044451 | A1* | 2/2015 | Kido | G03F 7/027 428/327 |
| 2015/0355570 | A1* | 12/2015 | Koyanagi | G03G 15/0818 428/411.1 |
| 2016/0154323 | A1* | 6/2016 | Nishioka | G03G 5/04 492/18 |
| 2016/0154335 | A1* | 6/2016 | Yamauchi | G03G 15/0233 399/176 |
| 2016/0154336 | A1* | 6/2016 | Masu | B32B 25/14 399/176 |
| 2016/0154366 | A1* | 6/2016 | Yamauchi | G03G 15/0233 399/176 |
| 2016/0297951 | A1* | 10/2016 | Kumano | C08L 47/00 |
| 2017/0248867 | A1* | 8/2017 | Sakurai | G03G 15/0808 |
| 2017/0260346 | A1* | 9/2017 | Hirata | C08J 5/06 |
| 2018/0112459 | A1* | 4/2018 | Aono | B05D 3/10 |
| 2018/0173129 | A1* | 6/2018 | Doi | G03G 15/0233 |
| 2018/0319945 | A1* | 11/2018 | Kogiso | B32B 27/34 |
| 2019/0049790 | A1* | 2/2019 | Okabe | G02B 6/0053 |
| 2019/0163118 | A1* | 5/2019 | Iwasaki | G03G 5/14752 |

FOREIGN PATENT DOCUMENTS

| | | |
|---|---|---|
| JP | 4806944 B | 11/2011 |
| JP | 2012140589 A | 7/2012 |
| JP | 2012140594 A | 7/2012 |
| JP | 2013125858 A | 6/2013 |
| JP | 2013181131 A | 9/2013 |
| JP | 2015-053412 A | 3/2015 |
| JP | 2017101131 A | 6/2017 |
| JP | 2017206591 A | 11/2017 |
| KR | 20100107043 A | 10/2010 |
| WO | 2014003159 A1 | 1/2014 |
| WO | 2014010524 A1 | 1/2014 |
| WO | 2016002780 A1 | 1/2016 |
| WO | 2016076096 A1 | 5/2016 |
| WO | WO2017204218 | 6/2018 |

* cited by examiner

CONDUCTIVE ADHESIVE COMPOSITION

TECHNICAL FIELD

The present invention relates to a conductive adhesive composition used for a printed wiring board.

BACKGROUND ART

Conductive adhesives made of an adhesive resin composition containing conductive fillers therein have been used to attach a reinforcing plate or an electromagnetic-wave shielding film to a printed wiring board. To attach the reinforcing plate or the electromagnetic-wave shielding film to the printed wiring board, an opening is formed in a cover lay of the printed wiring board to expose a circuit made of, e.g., copper foil, and the opening is filled with a conductive adhesive so that the circuit and the reinforcing plate or the electromagnetic-wave shielding film are electrically connected to each other.

An adhesive made of a thermosetting resin to which conductive fillers and silica particles having a given specific surface area have been added is disclosed as an example of such a conductive adhesive. It is disclosed that the addition of such silica particles contributes to reducing damage to an insulating layer without reducing the flexibility of the electromagnetic-wave shielding film as a whole (see, e.g., PATENT DOCUMENT 1). An adhesive sheet made of an adhesive composition containing polyurethane polyurea resin having a predetermined acid value and epoxy resin is also disclosed. It is disclosed that using such an adhesive sheet contributes to an improvement in reflow resistance (see, e.g., PATENT DOCUMENT 2).

CITATION LIST

Patent Document

PATENT DOCUMENT 1: Japanese Unexamined Patent Publication No. 2015-53412
PATENT DOCUMENT 2: Japanese Patent No. 4806944

SUMMARY OF THE INVENTION

Technical Problem

In general, the conductivity of a conductive adhesive and the adhesiveness thereof to a printed wiring board deteriorate when the conductive adhesive undergoes a reflow process (e.g., at 270° C. for 10 seconds). Thus, reflow resistance (i.e., high heat resistance that allows the conductive adhesive to withstand the reflow process, as well as the conductivity and good adhesiveness to the printed wiring board after the reflow process) is required for the conductive adhesive. In addition, the tendency in recent years of smaller electronic substrates leads to a smaller diameter of an opening formed in the cover lay.

However, the adhesive disclosed in PATENT DOCUMENT 1 has reduced adhesion to the reinforcing plate and the printed wiring board due to a smaller ratio of the thermosetting resin caused by the addition of silica particles.

Further, the adhesive sheet disclosed in PATENT DOCUMENT 2 has insufficient reflow resistance, because an interconnect resistance value increases when the adhesive composition filling the opening of the cover lay undergoes a reflow process.

In view of the foregoing background, it is an object of the present invention to provide a conductive adhesive composition which can exhibit good conductivity and adhesiveness to a printed wiring board even after a reflow process.

Solution to the Problem

To achieve the above object, a conductive adhesive composition of the present invention contains a thermosetting resin having a functional group reactive with an epoxy group, an epoxy resin, and a conductive filler, and further contains urethane resin particles having a mean particle diameter of 4 µm or more and 13 µm or less and a hardness of 55 or more and 90 or less measured by a type A durometer in conformity with JIS K6253.

Advantages of the Invention

The present invention can provide a conductive adhesive composition which exhibits good conductivity and adhesiveness to a printed wiring board even after a reflow process.

DETAILED DESCRIPTION

Figure 1:
FIG. 1 illustrates a cross-sectional view of a conductive adhesive film according to an embodiment of the present invention.

Particulars of a conductive adhesive composition according to the present invention will be described below. Note that the present invention is not limited to the embodiments which will be described below, and may be appropriately modified without deviating from the intent of the present invention.

A conductive adhesive composition of the present invention contains a thermosetting resin, a conductive filler (H), and urethane resin particles (I).

The thermosetting resin is not limited to a particular resin. A polyamide resin, a polyimide resin, an acrylic resin, a phenolic resin, an epoxy resin, a polyurethane resin, a polyurethane urea resin, a melamine resin, an alkyd resin, etc., may be used as the thermosetting resin. One kind of these resins may be used alone, or two or more kinds may be used together. Among them, a thermosetting resin having a functional group that can react with an epoxy group is preferable to achieve good reflow resistance. Examples of such a thermosetting resin includes an epoxy group-modified polyester resin, an epoxy group-modified polyamide resin, an epoxy group-modified acrylic resin, an epoxy group-modified polyurethane polyurea resin, a carboxyl group-modified polyester resin, a carboxyl group-modified polyamide resin, a carboxyl group-modified acrylic resin, and a carboxyl group-modified polyurethane polyurea resin. Among these resins, a carboxyl group-modified polyester resin, a carboxyl group-modified polyamide resin, and a carboxyl group-modified polyurethane polyurea resin are preferable.

If a carboxyl group-modified thermosetting resin is used as the thermosetting resin, it is preferable that its acid value is 2 mg KOH/g to 100 mg KOH/g, more preferably 2 mg KOH/g to 50 mg KOH/g, and still more preferably 3 mg KOH/g to 30 mg KOH/g. If the acid value is 2 mg KOH/g or more, the carboxyl group-modified thermosetting resin is cured enough together with an epoxy resin, which will be described later. The heat resistance of the conductive adhesive composition is therefore improved. If the acid value is 100 mg KOH/g or less, the carboxyl group-modified thermosetting resin is cured enough together with the epoxy resin, which will be described later. The peel strength of the conductive adhesive composition is therefore improved.

(Carboxyl Group-Modified Polyester Resin)
A carboxyl group-modified polyester resin can be obtained through a reaction between, for example, a hydroxyl group-containing polyester resin and a polybasic acid, or its anhydride, having 3 or more carboxyl groups in the molecule.

The hydroxyl group-containing polyester resin can be obtained through a reaction between diol and a dibasic acid, a dibasic acid anhydride, or a dialkyl ester of a dibasic acid.

Examples of the diol include a normal or branched aliphatic compound having 2 to 12 carbon atoms (namely, ethylene glycol, diethylene glycol, propylene glycol, neopentyl glycol, 1,2-propanediol, 1,3-butanediol, 1,4-butanediol, 1,5-pentanediol, 1,6-hexanediol, 2-n-butyl-2-ethyl-1,3-propanediol, 2,2,4-trimethyl-1,3-pentanediol, 2-ethyl-1,3-hexanediol, 2-diethyl-1,3-propanediol, 1,9-nonanediol, 2-methyl-1,8-octanediol, 1,4-cyclohexanedimethanol, or 3-methyl-1,5-pentanediol) or a diol of an aromatic compound having 6 to 15 carbon atoms (namely, aliphatic dihydric alcohol such as bisphenol A or bisphenol F to which an ethylene oxide or an propylene oxide has been added, hexylene glycol, and hydrogenated bisphenol A).

Examples of the dibasic acid or the dibasic acid anhydride which reacts with the diol include an aromatic dicarboxylic acid, an alicyclic dicarboxylic acid, an aliphatic dicarboxylic acid, or anhydrides of these acids.

Examples of the aromatic dicarboxylic acid or the anhydride of said acid include terephthalic acid, isophthalic acid, orthophthalic acid, 2,6-naphthalenedicarboxylic acid, 5-sodium sulfoisophthalic acid, or (dehydrated) phthalic acid. In the present specification, the "(dehydrated) phthalic acid," for example, collectively refers to a phthalic acid and a dehydrated phthalic acid.

Examples of the alicyclic dicarboxylic acid or the anhydride of said acid include tetrahydro (dehydrated) phthalic acid, hexahydro (dehydrated) phthalic acid, and 1,4-cyclohexanedicarboxylic acid. Examples of the aliphatic dicarboxylic acid or the anhydride of said acid include (dehydrated) succinic acid, fumaric acid, (dehydrated) maleic acid, adipic acid, sebacic acid, azelaic acid, and himic acid.

Examples of the dialkyl ester, which is a dibasic acid, used to react with the diol include an esterified compound obtained through esterification between the dibasic acid and a normal or branched alkyl alcohol having 1 to 18 carbon atoms. Examples of the normal or branched alkyl alcohol having 1 to 18 carbon atoms include methyl alcohol, ethyl alcohol, n-propyl alcohol, isopropyl alcohol, n-butyl alcohol, sec-butyl alcohol, tert-butyl alcohol, n-amyl alcohol, acetylisopropyl alcohol, neohexyl alcohol, isohexyl alcohol, n-hexyl alcohol, heptyl alcohol, octyl alcohol, decyl alcohol, dodecyl alcohol, or octadecyl alcohol.

Dimethyl phthalate and dimethyl isophthalate are preferable as a compound used as the dialkyl ester, which is a dibasic acid.

A carboxyl group-containing polyester resin can be obtained through a reaction between a hydroxyl group-containing polyester resin and a polybasic acid, or its anhydride, having 3 or more (preferably 3 or 4) carboxyl groups in the molecule.

Examples of the polybasic acid, or its anhydride, having 3 or more carboxyl groups in the molecule include (dehydrated) trimellitic acid, (dehydrated) pyromellitic acid, or ethylene glycol bistrimellitate dianhydride.

(Carboxyl Group-Modified Polyamide Resin)
The carboxyl group-modified polyamide resin is obtained through a condensation reaction between, for example, a polyvalent carboxylic acid component (such as a dicarboxylic acid, a tricarboxylic acid, and a tetracarboxylic dianhydride) and an organic diisocyanate or a diamine.

Examples of the polyvalent carboxylic acid include aliphatic dicarboxylic acid (such as succinic acid, glutaric acid, adipic acid, azelaic acid, sebacic acid, decanedioic acid, dodecanedioic acid, and dimer acid), aromatic dicarboxylic acid (such as isophthalic acid, terephthalic acid, phthalic acid, naphthalenedicarboxylic acid, diphenyl sulfone dicarboxylic acid, and oxydibenzoic acid), and aromatic carboxylic anhydride (such as trimellitic acid, pyromellitic acid, diphenylsulfonetetracarboxylic dianhydride, and benzophenonetetracarboxylic dianhydride). Note that one kind of these substances may be used alone, or two or more kinds thereof may be used in combination.

Examples of the organic diisocyanate include aromatic diisocyanate (such as 4,4'-diphenylmethane diisocyanate, 2,4-tolylene diisocyanate, 2,6-tolylene diisocyanate, 1,5-naphthalene diisocyanate, 3,3'-dimethyl-4,4'-diphenylmethane diisocyanate, p-phenylene diisocyanate, m-xylen diisocyanate, and m-tetramethyl xylen diisocyanate) and aliphatic isocyanate (such as hexamethylene diisocyanate, 2,2,4-trimethyl hexamethylene diisocyanate, isophorone diisocyanate, 4,4'-dicyclohexylmethane diisocyanate, trans-cyclohexane-1,4-diisocyanate, hydrogenated m-xylen diisocyanate, and lysine diisocyanate). One kind of these substances may be used alone, or two or more kinds thereof may be used in combination.

Note that the organic diisocyanate may be replaced with a diamine. Examples of the diamine include phenylenediamine, diamino diphenyl propane, diamino diphenyl methane, benzidine, 4,4'-diamino diphenyl sulfone, 4,4'-diamino diphenyl sulfide, and diamino diphenyl ether.

(Carboxyl Group-Modified Polyurethane Polyurea Resin)
It is preferable that the carboxyl group-modified polyurethane polyurea resin be polyurethane polyurea resin (F) obtained through a reaction between an urethane prepolymer (D) and a polyamino compound (E), wherein the urethane prepolymer (D) is obtained through a reaction among a polyol compound (A), a diisocyanate compound (B), and a diol compound (C) having a carboxyl group.

<Polyol Compound (A)>
The polyol compound used herein is not limited to a particular polyol compound, and a known polyol used in the urethane synthesis can be used. Examples of such a polyol include polyester polyol, polyether polyol, polycarbonate polyol, and other polyols.

Examples of the polyester polyol include a substance obtained through polycondensation between aliphatic dicarboxylic acid (for example, succinic acid, adipic acid, sebacic acid, glutaric acid, and azelaic acid) and/or aromatic dicarboxylic acid (for example, isophthalic acid and terephthalic acid) and low molecular weight glycol (for example, ethylene glycol, 1,2-propylene glycol, 1,3-propylene glycol, 1,4-butylene glycol, 1,6-hexamethylene glycol, neopentyl glycol, and 1,4-bis-hydroxymethyl cyclohexane).

Particular examples of such a polyester polyol include polyethylene adipate diol, polybutylene adipate diol, polyhexamethylene adipate diol, polyneopentyl adipate diol, polyethylene/butylene adipate diol, polyneopentyl/hexyl adipate diol, poly-3-methylpentane adipate diol, polybutylene isophthalate diol, polycaprolactone diol, and poly-3-methylvalerolactone diol.

Particular examples of the polyether polyol include polyethylene ethylene glycol, polypropylene glycol, poly tetramethylene glycol, and a random/block copolymer of these substances. Particular examples of the polycarbonate polyol include polytetramethylene carbonate diol, poly pentamethylene carbonate diol, polyneopentyl carbonate diol, polyhexamethylene carbonate diol, poly(1,4-cyclohexanedimethylene carbonate)diol, and a random/block copolymer of these substances.

Other particular examples of the polyol include dimer diol, polybutadiene polyol and hydrogenated polybutadiene polyol, polyisoprene polyol and hydrogenated polyisoprene polyol, acrylic polyol, epoxy polyol, polyether ester polyol, siloxane-modified polyol, α,ω-polymethyl methacrylate diol, and α,ω-polybutyl methacrylate diol.

The number average molecular weight (Mn, according to an end-group determination method) of the polyol compound (A) is not particularly limited, but preferably 500 to 3,000. If the number average molecular weight (Mn) of the polyol compound (A) is less than 500, the mechanical properties tend to decrease due to difficulties in development of the cohesive force of urethane bond. Further, a crystalline polyol having the number average molecular weight of over 3,000 may cause a whitening phenomenon of a film made of such a crystalline polyol. One kind of the polyol compound (A) may be used alone, or two or more kinds thereof may be used in combination.

It is also preferable to use, as needed, a short-chain diol component and/or a diamine component as a reaction component for obtaining the urethane prepolymer (D). If said components are used, the hardness, viscosity, and other properties of the polyurethane polyurea resin (F) can be controlled easily. Particular examples of the short-chain diol component include: aliphatic glycol (such as ethylene glycol, 1,2-propylene glycol, 1,3-propylene glycol, 1,4-butylene glycol, 1,6-hexamethylene glycol, and neopentyl glycol) and alkylene oxide adduct thereof of low molecular weight (the number average molecular weight of less than 500 according to an end-group determination method); alicyclic glycol (such as 1,4-bis-hydroxymethyl cyclohexane, and 2-methyl-1,1-cyclohexanedimethanol) and an alkylene oxide adduct thereof of a low molecular weight (the number average molecular weight of less than 500, same as above); aromatic glycol (such as xylylene glycol) and an alkylene oxide adduct thereof of a low molecular weight (the number average molecular weight of less than 500, same as above); bisphenol (such as bisphenol A, thiobisphenol, and sulfone bisphenol) and an alkylene oxide adduct thereof of a low molecular weight (the number average molecular weight of less than 500, same as above); and alkyldialkanolamine such as C1-C18 alkyldiethanolamine.

Particular examples of the short-chain diamine compound include: aliphatic diamine compound, such as methylenediamine, ethylenediamine, trimethylenediamine, hexamethylenediamine, and octamethylenediamine; aromatic diamine compound, such as phenylenediamine, 3,3'-dichloro-4,4'-diamino diphenyl methane, 4,4'-methylenebis(phenylamine), 4,4'-diamino diphenyl ether, and 4,4'-diamino diphenyl sulfone; and alicyclic diamine compound, such as cyclopenthyl diamine, cyclohexyl diamine, 4,4'-diaminodicyclohexylmethane, 1,4-diaminocyclohexane, and isophoronediamine. Further, hydrazines such as hydrazine, carbodihydrazide, adipic acid dihydrazide, sebacic dihydrazide, and phthalic acid dihydrazide may also be used as the diamine compound. Examples of a long-chain diamine compound include long-chain alkylene diamine, polyoxy alkylene diamine, amine-terminated polyamide, and siloxane-modified polyamines. One kind of these diamine compounds may be used alone, or two or more kinds thereof may be used in combination.

<Diisocyanate Compound (B)>

The diisocyanate compound (B) used herein is not limited to a particular diisocyanate compound, and a known diisocyanate compound used in forming polyurethane can be used. Particular examples of the diisocyanate compound (B) include: aromatic diisocyanate, such as toluene-2,4-diisocyanate, 4-methoxy-1,3-phenylene diisocyanate, 4-isopropyl-1,3-phenylene diisocyanate, 4-chlor-1,3-phenylene diisocyanate, 4-butoxy-1,3-phenylene diisocyanate, 2,4-diisocyanate diphenyl ether, 4,4'-methylenebis(phenylene isocyanate) (MDI), durylene diisocyanate, tolidine diisocyanate, xylylene diisocyanate (XDI), 1,5-naphthalene diisocyanate, benzidine diisocyanate, o-nitrobenzidine diisocyanate, and 4,4'-diisocyanate dibenzyl; aliphatic diisocyanate, such as methylene diisocyanate, 1,4-tetramethylene diisocyanate, 1,6-hexamethylene diisocyanate, and 1,10-decamethylene diisocyanate; alicyclic diisocyanate, such as 1,4-cyclohexylene diisocyanate, methylenebis(4-cyclohexylisocyanate), 1,5-tetrahydronaphthalene diisocyanate, isophorone diisocyanate, hydrogenated MDI, and hydrogenated XDI; and isocyanate-terminated polyurethane prepolymer obtained through a reaction between these diisocyanates and polyol or polyamine of low molecular weight.

<Diol Compound (C) Having Carboxyl Group>

The diol compound (C) having a carboxyl group which is used herein is not limited to a particular diol compound. Examples of the diol compound (C) having a carboxyl group include: dimethylol alkanoic acid, such as dimethylol propionic acid and dimethylol butanoic acid); a low molecular weight alkylene oxide adduct of dimethylol alkanoic acid (the number average molecular weight of less than 500 according to an end-group determination method); a low molecular weight ε-caprolactone adduct of dimethylol alkanoic acid (the number average molecular weight of less than 500 according to an end-group determination method); half-esters induced by an acid anhydride of dimethylol alkanoic acid and glycerin; and a compound obtained through a free radical reaction among a hydroxyl group of dimethylol alkanoic acid, a monomer having an unsaturated bond, and a monomer having a carboxyl group and an unsaturated bond. Among them, dimethylol alkanoic acid, such as dimethylol propionic acid and dimethylol butanoic acid, is suitable in terms of availability and easiness of adjustment of acid values.

<Urethane Prepolymer (D)>

The urethane prepolymer (D) used herein can be obtained through a reaction among the above-described polyol compound (A), diisocyanate compound (B), and diol compound (C) having a carboxyl group.

In the reaction, it is preferable that an equivalent ratio of the diisocyanate compound (B) with respect to the hydroxyl groups of the polyol compound (A) and the diol compound (C) having a carboxyl group ranges from 1.1 to 2.5. This range is preferable because a mechanically strong conductive adhesive composition with good heat-resistant properties can be formed. A reaction temperature is not particularly limited, but may range from 60° C. to 100° C. in example embodiments.

<Reaction Stopper>

A reaction stopper may be used as necessary during the formation of the urethane prepolymer (D) through a reaction between the polyol compound (A), the diisocyanate compound (B), and the diol compound (C) having a carboxyl group, in order to adjust the molecular weight of the urethane prepolymer. Examples of the reaction stopper include a monoalcohol compound, a monoamine compound, and an alkanolamine compound. Examples of the monoalcohol include methanol, ethanol, butanol, and isopropanol. Examples of the monoamine compound include butylamine and dibutylamine. Examples of the alkanolamine include monoethanolamine and diethanolamine.

<Polyamino Compound (E)>

The polyamino compound (E) used herein is not limited to a particular polyamino compound, and a known polyamino compound used in forming a polyurea resin can be used. Particular examples of the polyamino compound (E) include compounds such as diamines (such as ethylenediamine, 1,6-hexamethylenediamine, piperazine, 2,5-dimethylpiperazine, isophoronediamine, 4,4'-dicyclohexylmethane diamine, 3,3'-dimethyl-4,4'-dicyclohexylmethane diamine, 1,2-cyclohexanediamine, 1,4-cyclohexanediamine, and 1,2-propanediamine), and aminoalkyl alkanolamines (such as aminoethyl ethanolamine, aminopropyl ethanolamine, aminohexyl ethanolamine, aminoethyl propanolamine, aminopropyl propanolamine, and aminohexyl propanolamine).

<Polyurethane Polyurea Resin (F)>

The weight average molecular weight of the polyurethane polyurea resin (F) used herein ranges from 50000 to 100000, in general.

<Epoxy Resin>

The epoxy resin used herein is not limited to a particular epoxy resin, and a known epoxy resin having two or more epoxy groups in one molecule can be used. Examples of such an epoxy resin include bisphenol epoxy resin (such as bisphenol A epoxy resin, bisphenol F epoxy resin, bisphenol S epoxy resin), glycidyl ether epoxy resin (such as spirocyclic epoxy resin, naphthalene epoxy resin, biphenyl epoxy resin, terpene epoxy resin, tris(glycidyloxyphenyl)methane, and tetrakis(glycidyloxyphenyl)ethane), glycidyl amine epoxy resin (such as tetraglycidyl diamino diphenylmethane), novolac epoxy resin (such as tetrabromobisphenol A epoxy resin, cresol novolac epoxy resin, phenol novolac epoxy resin, α-naphthol novolac epoxy resin, and brominated phenol novolac epoxy resin), and rubber-modified epoxy resin. One kind of these resins may be used alone, or two or more kinds thereof may be used together.

The epoxy equivalent of the epoxy resin preferably ranges from 800 to 100000. This range is preferable because the adhesion to the reinforcing plate improves.

When two or more kinds of epoxy resin are used together, it is preferable that epoxy resin having the epoxy equivalent ranging from 800 to 10000 and epoxy resin having the epoxy equivalent ranging from 90 to 300 be used together. In this case, the epoxy resin having the epoxy equivalent ranging from 800 to 10000 and the epoxy resin having the epoxy equivalent ranging from 90 to 300 may be the same kind, or may have different chemical structures.

It is preferable to use the epoxy resin having the epoxy equivalent ranging from 800 to 10000 because the adhesion to the reinforcing plate improves. The lower limit of the epoxy equivalent is preferably 1000, more preferably 1500. The upper limit of the epoxy equivalent is preferably 5000, more preferably 3000. Preferably, the epoxy resin having the epoxy equivalent ranging from 800 to 10000 is solid at room temperature. Being solid at room temperature means staying solid with no flowability at a temperature of 25° C. without a solvent.

Examples of commercially available epoxy resins having the epoxy equivalent ranging from 800 to 10000 include EPICLON4050, 7050, HM-091, and HM-101 (trade names manufactured by DIC Corporation), and jER1003F, 1004, 1004AF, 1004FS, 1005F, 1006FS, 1007, 1007FS, 1009, 1009F, 1010, 1055, 1256, 4250, 4275, 4004P, 4005P, 4007P, and 4010P (trade names manufactured by Mitsubishi Chemical Corporation).

It is preferable to use the epoxy resin having the epoxy equivalent ranging from 90 to 300 because the heat resistance of the resin improves. The lower limit of the epoxy equivalent is preferably 150, more preferably 170. The upper limit of the epoxy equivalent is preferably 250, more preferably 230. Preferably, the epoxy resin having the epoxy equivalent ranging from 90 to 300 is solid at room temperature.

It is more preferable that the epoxy resin having the epoxy equivalent ranging from 90 to 300 be novolac epoxy resin. Novolac epoxy resin mixes well with another epoxy resin, despite its high epoxy resin density, and has only a little difference in the reactivity between epoxy groups. Thus, an entire coating film can have a high crosslink density in a uniform manner.

The novolac epoxy resin is not limited to a particular novolac epoxy resin. Examples of the novolac epoxy resin may include cresol novolac epoxy resin, phenol novolac epoxy resin, α-naphthol novolac epoxy resin, and brominated phenol novolac epoxy resin.

Examples of commercially available epoxy resins having the epoxy equivalent ranging from 90 to 300 include EPICLONN-660, N-665, N-670, N-673, N-680, N-695, N-655-EXP-S, N-662-EXP-S, N-665-EXP, N-665-EXP-S, N-672-EXP, N-670-EXP-S, N-685-EXP, N-673-80M, N-680-75M, N-690-75M, N-740, N-770, N-775, N-740-80M, N-770-70M, N-865, and N-865-80M (trade names manufactured by DIC Corporation), jER152, 154, and 157S70 (trade names manufactured by Mitsubishi Chemical Corporation), and YDPN-638, YDCN-700, YDCN-700-2, YDCN-700-3, YDCN-700-5, YDCN-700-7, YDCN-700-10, YDCN-704, and YDCN-700-A (trade names manufactured by Nippon Steel Chemical Co., Ltd.).

If a novolac epoxy resin is used as the epoxy resin having the epoxy equivalent ranging from 90 to 300, the epoxy resin having the epoxy equivalent ranging from 800 to 10000 is preferably an epoxy resin other than the novolac epoxy resin which is solid at room temperature. If the adhesive layer is made of only the novolac epoxy resin, the adhesiveness may not be enough. It is therefore preferable to use, as the epoxy resin having the epoxy equivalent ranging from 800 to 10000, an epoxy resin other than such novolac epoxy resin.

In the present invention, a ratio of the epoxy resin to the thermosetting resin having a functional group reactive with an epoxy group is preferably 50 parts by mass to 500 parts by mass, more preferably 50 parts by mass to 300 parts by mass, and still more preferably 50 parts by mass to 200 parts by mass in view of the adhesiveness after a complete adhesion, with respect to 100 parts by mass of the thermosetting resin having a functional group reactive with an epoxy group. The ratio is set within this range because a degree of crosslinking with the thermosetting resin having a functional group reactive with an epoxy group is suitably adjusted, thereby improving the flexibility of the conductive adhesive composition and the electromagnetic-wave shielding film and the adhesiveness to the printed wiring board. In particular, containing 50 parts by mass or more of the epoxy resin with respect to 100 parts by mass of the thermosetting resin having a functional group reactive with an epoxy group improves the reflow resistance, the adhesiveness after the complete adhesion, and the adhesiveness to the resin plate, whereas containing 500 parts by mass or less of the epoxy resin improves the adhesiveness to a metal material such as a gold-plated object.

<Conductive Filler>

The conductive adhesive film of the present invention contains a conductive filler (H). The conductive filler (H) is not particularly limited. For example, metal filler, metal-sheathed resin filler, carbon filler, and a mixture of these fillers may be used as the conductive filler (H). Examples of the metal fillers include copper powder, silver powder, nickel powder, silver-coated copper power, gold-coated copper powder, silver-coated nickel powder, and gold-coated nickel powder. These metal powders can be obtained through electrolysis, atomization, and reduction.

In particular, it is preferable that a mean particle diameter of the conductive filler be 3 µm to 50 µm so that the fillers are more likely to contact to each other. The conductive filler may be in spherical, flake, dendritic, fiber, or other forms.

It is preferable that the conductive filler (H) be at least one selected from a group consisting of silver powder, silver-coated copper power, and copper powder, in terms of the interconnect resistance and costs.

The content of the conductive filler (H) is preferably 40% by mass to 90% by mass with respect to the total amount of the conductive adhesive composition.

The conductive adhesive film may contain, within a range that does not degrade solder reflow resistance properties, a silane coupling agent, an antioxidant, a pigment, a colorant, a tackifier resin, a plasticizer, an ultraviolet absorber, an anti-foam agent, a leveling control agent, a filler, a fire retardant, etc.

<Urethane Resin Particle>

The urethane resin particles (I) contained in the conductive adhesive composition of the present invention have a mean particle diameter of 4 µm or more and 13 µm or less, and preferably of 5 µm or more and 7 µm or less.

The "mean particle diameter" used herein refers to 50% particle diameter (D50) which can be measured by a particle size distribution measuring device (Nanotrac (registered trademark) UPA-EX150 manufactured by NIKKISO CO., LTD.) that applies a laser Doppler method.

The urethane resin particles, the hardness of which measured by a type A durometer in conformity with JIS K6253 (i.e., the type A durometer hardness) is in a range between 55 and 90, are used as the urethane range particles (I) of the present invention. The hardness is determined in this range because if the hardness is less than 55, the reflow resistance may sometimes be insufficient, and if the hardness is greater than 90, the adhesion strength may sometimes be insufficient.

In this manner, in the conductive adhesive composition of the present invention, the mean particle diameter of the urethane resin particles (I) is set to be 4 µm or more and 13 µm or less, and the hardness of the urethane resin particles (I) is set to be 55 or more and 90 or less. It is therefore possible to obtain a conductive adhesive composition having good conductivity and good adhesiveness to a printed wiring board even after a reflow process.

The content of the urethane resin particles (I) with respect to the total amount of the conductive adhesive composition preferably ranges from 3% by mass to 30% by mass. The content is set to this range because if the content is less than 3% by mass and greater than 10% by mass, the interconnect resistance may become unstable.

<Curing Agent>

The conductive adhesive film of the present invention may contain a curing agent as necessary. The curing agent is not limited to a particular curing agent. A known curing agent, such as an isocyanate compound, a blocked isocyanate compound, a carbodiimide compound, an oxazoline compound, melamine, and a metal complex-based crosslinker, can be used.

Examples of the diisocyanate compound include aromatic diisocyanate (such as toluene-2,4-diisocyanate, 4-methoxy-1,3-phenylene diisocyanate, 4-isopropyl-1,3-phenylene diisocyanate, 4-chlor-1,3-phenylene diisocyanate, 4-butoxy-1,3-phenylene diisocyanate, 2,4-diisocyanate diphenyl ether, 4,4'-methylenebis(phenylene isocyanate) (MDI), durylene diisocyanate, tolidine diisocyanate, xylylene diisocyanate (XDI), 1,5-naphthalene diisocyanate, benzidine diisocyanate, o-nitrobenzidine diisocyanate, and 4,4'-diisocyanate dibenzyl); aliphatic diisocyanate (such as methylene diisocyanate, 1,4-tetramethylene diisocyanate, 1,6-hexamethylene diisocyanate, and 1,10-decamethylene diisocyanate); alicyclic diisocyanate (such as 1,4-cyclohexylene diisocyanate, 4,4-methylenebis(cyclohexylisocyanate), 1,5-tetrahydronaphthalene diisocyanate, isophorone diisocyanate, hydrogenated MDI, and hydrogenated XDI); and isocyanate-terminated polyurethane prepolymer obtained through a reaction between these diisocyanates and polyol or polyamine of low molecular weight. Further, known isocyanurate form, burette form, adduct form, and polymeric form of these isocyanate compounds which have a polyfunctional isocyanate group can be used as non-limiting examples of the diisocyanate compound.

Blocked isocyanate compounds obtained from said isocyanate compounds through a known method can be used as the blocked isocyanate compound. Compounds which are to be blocked are not particularly limited, and examples of such compounds include: a phenol-based compound (such as phenol, cresol, xylenol, chlorophenol, and ethylphenol); a lactam-based compound (such as ε-caprolactam, δ-valerolactam, γ-butyrolactam, and β-propiolactam); an active methylene-based compound (such as ethyl acetoacetate and acetylacetone); an alcohol-based compound (such as methanol, ethanol, propanol, isopropanol, n-butanol, isobutanol, t-butanol, amylalcohol, ethylene glycol monomethyl ether, ethylene glycol monoethyl ether, ethylene glycol mono 2-ethylhexyl ether, propylene glycol monomethyl ether, methyl glycolate, butyl glycolate, diacetone alcohol, methyl lactate and ethyl lactate, and furfuryl alcohol); an oxime-based compound (such as formaldoxime, acetaldoxime, acetoxime, methyl ethyl ketoxime, diacetyl monoxime, and cyclohexane oxime); a mercaptan-based compound (such as butyl mercaptan, hexyl mercaptan, t-butyl mercaptan, thiophenol, methyl thiophenol, and ethyl thiophenol); an acid amide-based compound (such as acetic acid amide, and benzamide); an imide-based compound (such as succinimide and maleic acid imide); an imidazole-based compound (such as imidazole, and 2-ethylimidazole); a secondary amine-based compound (such as dimethylamine, diethylamine, and dibutylamine); and a pyrazole-based compound (such as pyrazole, 3-methylpyrazole, and 3,5-dimethylpyrazole); etc.

The carbodiimide compound is not limited to a particular carbodiimide compound, and examples of the carbodiimide compound include substances obtained from said isocyanate compounds through a decarbonation condensation reaction.

The oxazoline compound is not particularly limited, and examples of the oxazoline compound include: a dioxazoline compound (such as 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4-dimethyl-2-oxazoline), 2,2'-(1,3-phenylene)-bis-(2-oxazoline), 2,2'-(1,3-phenylene)-bis-(4,4-dimethyl-2-oxazoline), 2,2'-(1,4-phenylene)-bis-(2-oxazoline), bis-(2-oxazolinylcyclohexane)sulfide, and bis-2(oxazolinylnorbornane)sulfide); a trioxazoline compound (such as 2,2'-(1,2,4-phenylene)-tris-(2-oxazoline)); and an oxazoline group-containing polymer (such as styrene-2-isopropenyl-2-oxazoline copolymer).

An appropriate amount of these curing agents is effective in improving the heat resistance. An excessive amount of these curing agents may degrade the flexibility and adhesiveness. Thus, the curing agent is used preferably in an amount of 0.1 to 200 parts by mass or less, and more preferably in an amount of 0.2 to 100 parts by mass, with respect to 100 parts by mass of a resin component of the thermosetting resin having a functional group reactive with an epoxy group.

In forming the conductive adhesive film of the present invention, an imidazole-based curing promoter may also be used to promote curing of the curing agent. The curing promoter is not particularly limited, and examples of the curing promoter include compounds in which an alkyl group, an ethylcyano group, a hydroxyl group, an azine, etc., are added to the imidazole ring, such as 2-phenyl-4,5-dihydroxymethyl imidazole, 2-heptadecylimidazole, 2,4-diamino-6-(2'-undecyl imidazolyl)ethyl-S-triazine, 1-cyanoethyl-2-phenylimidazole, 2-phenylimidazole, 5-cyano-2-phenylimidazole, 2,4-diamino-6-[2'methylimidazolyl-(1')]-ethyl-S-triazine isocyanuric acid adduct, 2-phenyl imidazole isocyanuric acid adduct, 2-methyl imidazole isocyanuric acid adduct, and 1-cyanoethyl-2-phenyl-4,5-di(2-cyanoethoxy)methylimidazole. An appropriate amount of these curing promoters is effective in improving the heat resistance. An excessive amount of these curing promoters may degrade the flexibility and adhesiveness. Thus, the curing promoter is used preferably in an amount of 0.01 to 1.0 parts by mass with respect to 100 parts by mass of a resin component of the thermosetting resin having a functional group reactive with an epoxy group.

<Conductive Adhesive Film>

As illustrated in FIG. 1, the conductive adhesive film 1 of the present invention includes a separable base 2 (a releasable film) and a conductive adhesive layer 4 obtained by coating a surface of the separable base 2 with the above-described conductive adhesive composition. The coating method is not particularly limited. Known coating devices typically used, for example, in die coating, lip coating, and comma coating, etc., can be used. The conditions under which the separable base 2 is coated with the conductive adhesive composition are appropriately determined.

It is possible to use, as the separable base 2, a base film, made of polyethylene terephthalate, polyethylene naphthalate, or other materials, to which a silicone or non-silicone release agent is applied on a surface where the conductive adhesive layer 4 is formed. The thickness of the separable base 2 is not particularly limited and appropriately determined in view of ease of use.

The thickness of the conductive adhesive layer 4 is preferably in a range of 15 μm to 100 μm. Elements are not well embedded in the layer of a thickness less than 15 μm, and a sufficient connection to a ground circuit may not be established. The layer of a thickness greater than 100 μm is not cost effective, and fails to satisfy demand for a thinner layer. If the thickness is set to be in such a range, the conductive adhesive composition flows adequately into a recess, if any, of the base and fills the recess, and the layer can adhere well to the base.

<Anisotropic Conductive Adhesive Layer And Isotropic Conductive Adhesive Layer>

The conductive adhesive composition of the present invention can be used as an anisotropic conductive adhesive layer or an isotropic conductive adhesive layer depending on the purpose of use. For example, the conductive adhesive composition of the present invention can be used as an isotropic conductive adhesive layer, when used as a conductive adhesive film for adhesion to a reinforcing plate.

The conductive adhesive composition of the present invention can be used as an isotropic conductive adhesive layer or an anisotropic conductive adhesive layer, preferably as an anisotropic conductive adhesive layer, when used as an electromagnetic-wave shielding film having a metal layer.

The conductive adhesive composition can be either an isotropic or anisotropic conductive adhesive layer depending on the content of the conductive fillers (H). To be an anisotropic conductive adhesive layer, the conductive adhesive composition contains the conductive fillers preferably at 5% by mass or more and less than 40% by mass with respect to the entire solid content of the conductive adhesive composition. To be an isotropic conductive adhesive layer, the conductive adhesive composition contains the conductive fillers (H) preferably at 40% by mass or more and 90% by mass or less with respect to the entire solid content of the conductive adhesive composition.

A conductive adhesive film using the conductive adhesive of the present invention has good adhesiveness to a printed wiring board. The adhesiveness to the printed wiring board includes adhesiveness to a resin plate, such as a polyimide film, and adhesiveness to a metal material, such as gold-plated copper foil and a conductive reinforcing plate.

<Electromagnetic-Wave Shielding Film>

Figure 2:
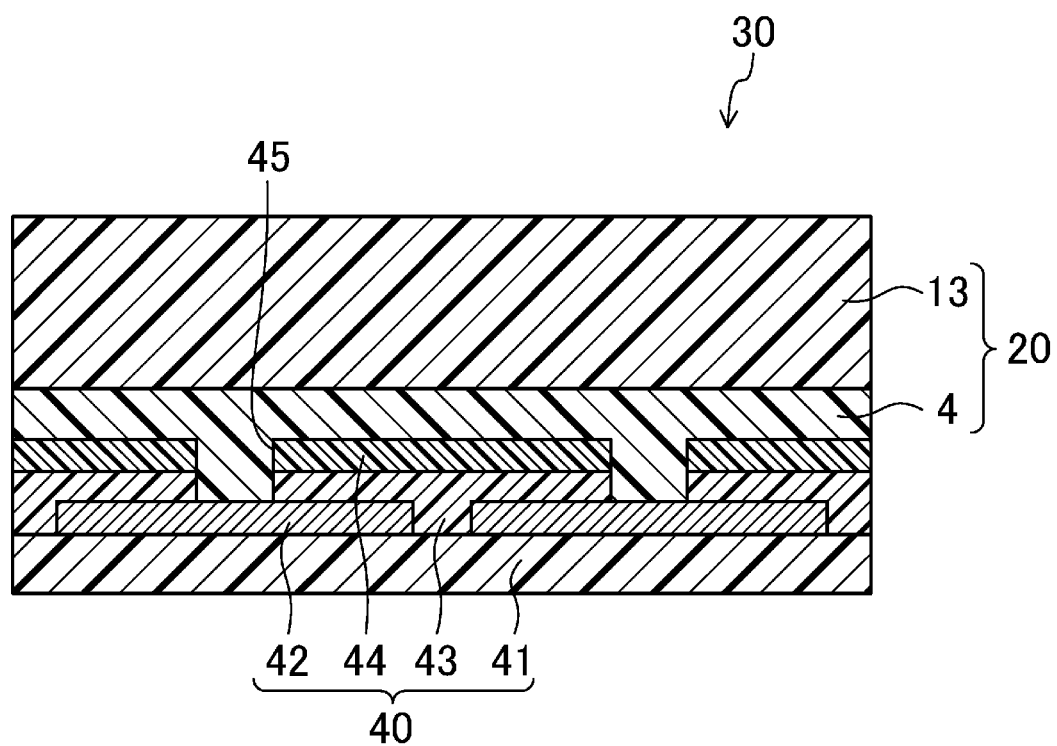
FIG. 2 illustrates a cross-sectional view of a shield printed wiring board according to an embodiment of the present invention.

As illustrated in FIG. 2, the electromagnetic-wave shielding film 20 made of the conductive adhesive composition of the present invention includes the conductive adhesive layer 4 and a protective layer 13 provided on a surface of the conductive adhesive layer 4. The protective layer 13 is not particularly limited as long as the protective layer 13 has insulation properties (i.e., a layer made of an insulating resin composition), and a known material can be used as the protective layer 13. The resin component used for the above-mentioned conductive adhesive layer 4 (excluding the conductive fillers) may be used as the protective layer 13. The protective layer 13 may be a stack of two or more layers made of different materials or having different physical properties such as the hardness or the elasticity modulus.

Further, the thickness of the protective layer 13 is not particularly limited and can be appropriately determined as necessary. The thickness of the protective layer 13 may be 1 μm or more (preferably 4 μm or more) and 20 μm or less (preferably 10 μm or less and more preferably 5 μm or less).

The protective layer 13 may contain, as necessary, a curing promoter, a tackifier agent, an antioxidant, a pigment, a colorant, a plasticizer, an ultraviolet absorber, an anti-foam agent, a leveling agent, a filler, a fire retardant, a viscosity modifier, an antiblocking agent, etc.

The electromagnetic-wave shielding film 20 may be obtained, for example, by the following method: a resin composition for forming the protective layer is applied to one surface of a separable film and is dried to form the protective layer 13, to which the above-described conductive adhesive composition is then applied and is dried to form the conductive adhesive layer 4.

The conductive adhesive layer 4 and the protective layer 13 can be formed by known coating methods, such as gravure coating, kiss coating, die coating, lip coating, comma coating, blade coating, roll coating, knife coating, spray coating, bar coating, spin coating, and dip coating techniques.

The electromagnetic-wave shielding film 20 can adhere to the printed wiring board by hot pressing. The conductive adhesive layer 4 of the electromagnetic-wave shielding film 20 is softened by the heat applied, and flows into a ground portion provided on the printed wiring board due to the pressure applied. As a result, the ground circuit and the conductive adhesive are electrically connected to each other, thereby making it possible to improve the shielding effect.

The electromagnetic-wave shielding film 20 can be used, for example, as a shield printed wiring board 30 illustrated in FIG. 2. The shield printed wiring board 30 includes a printed wiring board 40 and an electromagnetic-wave shielding film 20.

The printed wiring board 40 includes a base substrate 41, a printed circuit (i.e., a ground circuit) 42 formed on the base substrate 41, an insulating adhesive layer 43 provided on the base substrate 41 so as to be adjacent to the printed circuit 42, and an insulating cover lay 44 provided so as to cover the insulating adhesive layer 43. The insulating adhesive layer 43 and the cover lay 44 form an insulating layer of the printed wiring board 40. The insulating adhesive layer 43 and the cover lay 44 are provided with an opening 45 through which part of the printed circuit 42 is exposed.

Materials for the base substrate 41, the insulating adhesive layer 43, and the cover lay 44 are not particularly limited, and a resin film, for example, may be used as the material for these elements. In such a case, the elements can be made of a resin, such as polypropylene, cross-linked polyethylene, polyester, polybenzimidazole, polyimide, polyimideamide, polyetherimide, and polyphenylene sulfide. The printed circuit 42 cab be a copper wiring pattern formed on the base substrate 41.

Now, a method for forming the shield printed wiring board 30 will be described. The electromagnetic-wave shielding film 20 is placed on the printed wiring board 40, and pressed and heated by a press machine. Part of the adhesive layer 4 which has been softened by the heat flows into the opening 45 due to the pressure applied. As a result, the electromagnetic-wave shielding film 20 adheres to the printed wiring board 40 via the adhesive layer 4.

<Electromagnetic-Wave Shielding Film Including Metal Layer>

The electromagnetic-wave shielding film of the present invention may include a metal layer. The electromagnetic-wave shielding film having a metal layer can have better electromagnetic-wave shielding properties.

Figure 3:
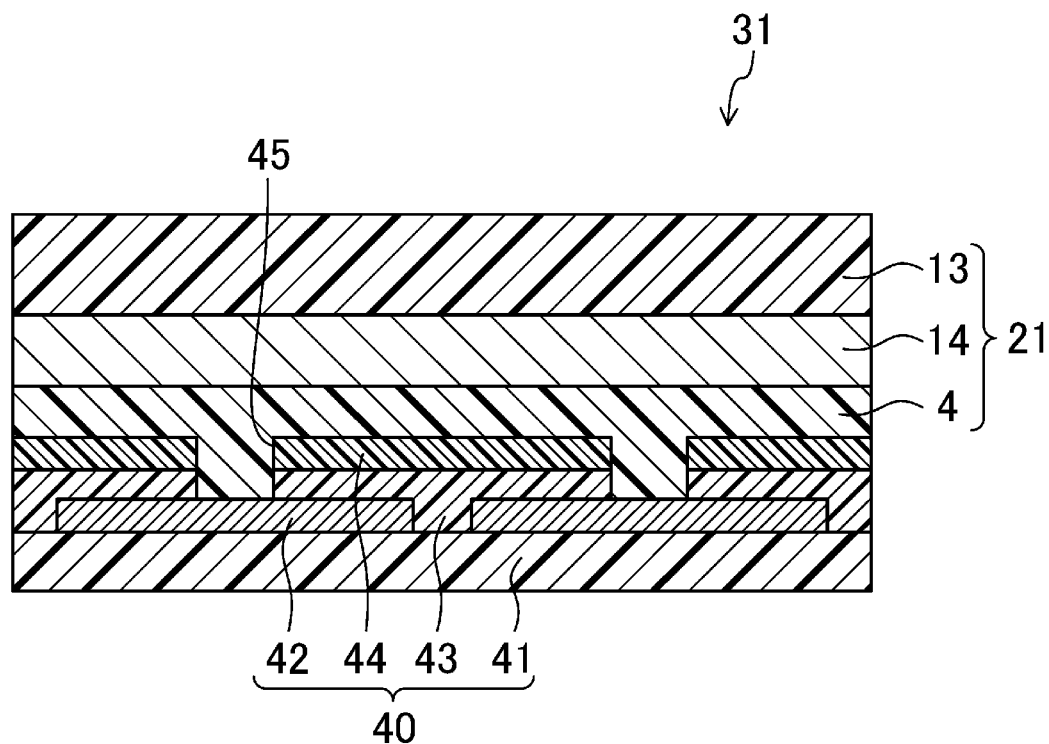
FIG. 3 illustrates a cross-sectional view of a shield printed wiring board according to an embodiment of the present invention.

More specifically, for example, as illustrated in FIG. 3, an electromagnetic-wave shielding film 21 made of the conductive adhesive composition of the present invention includes a metal layer (a shielding layer) 14, a conductive adhesive layer 4 provided on a first surface of the metal layer 14, and a protective layer 13 provided on a second surface, opposite to the first surface, of the metal layer 14.

Examples of the metal material which forms the metal layer 14 include nickel, copper, silver, tin, gold, palladium, aluminum, chromium, titanium, zinc, and an alloy containing one or two or more of these metals which can be appropriately selected according to the required electromagnetic-wave shielding effect and tolerance to repeated flexing and sliding.

The thickness of the metal layer 14 is not particularly limited, and may be set to be in a range between 0.1 μm to 8 μm, for example. Example methods for forming the metal layer 14 include electroplating, electroless plating, sputtering, electron-beam evaporation, vacuum evaporation, CVD, and a metal organic CVD methods. The metal layer 14 may be made of a metal foil or metal nanoparticles.

The electromagnetic-wave shielding film 21 can be used, for example, as a shield printed wiring board 31 illustrated in FIG. 3. The shield printed wiring board 31 includes the above-described printed wiring board 40 and the electromagnetic-wave shielding film 21.

Now, a method for forming the shield printed wiring board 31 will be described. The electromagnetic-wave shielding film 21 is placed on the printed wiring board 40, and pressed and heated by a press machine. Part of the adhesive layer 4 which has been softened by the heat flows into the opening 45 due to the pressure applied. As a result, the electromagnetic-wave shielding film 21 adheres to the printed wiring board 40 with the adhesive layer 4 therebetween. In addition, the metal layer 14 and the printed circuit 42 of the printed wiring board 40 are connected to each other via a conductive adhesive.

<Shield Printed Wiring Board With Reinforcing Plate>

Figure 4:
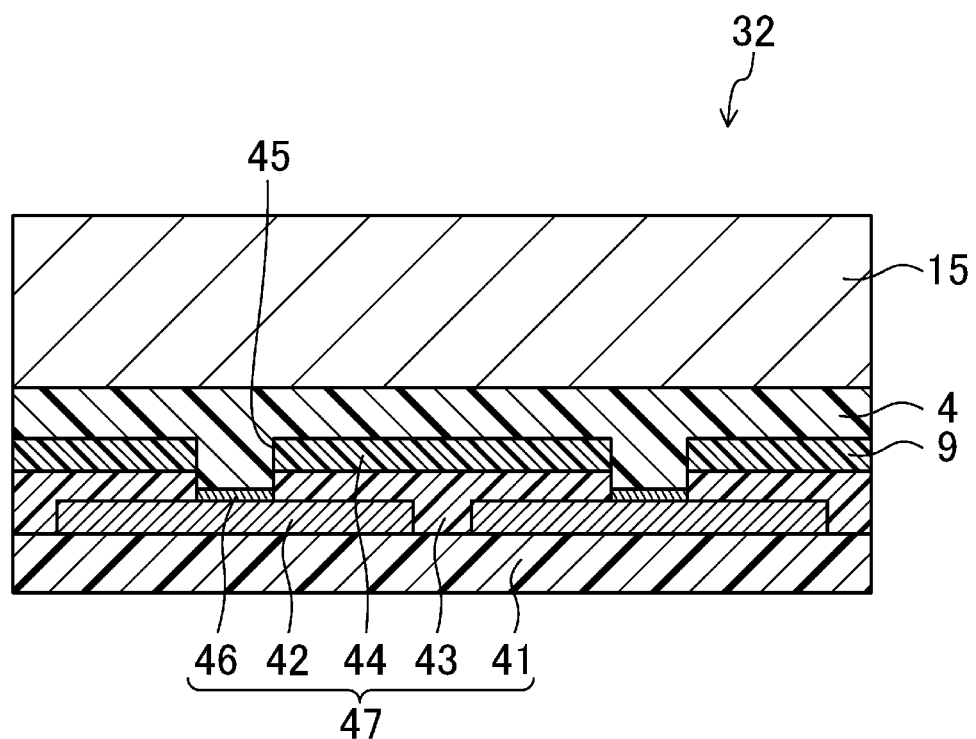
FIG. 4 illustrates a cross-sectional view of a shield printed wiring board according to an embodiment of the present invention.

The conductive adhesive composition of the present invention can be used as a shield printed wiring board with a reinforcing plate. More specifically, the conductive adhesive composition of the present invention can be used as a shield printed wiring board 32 illustrated in FIG. 4. The shield printed wiring board 32 includes a printed wiring board 47, a conductive adhesive layer 4, and a conductive reinforcing plate 15. The printed wiring board 47 and the conductive reinforcing plate 15 adheres, and are electrically connected, to each other by the conductive adhesive layer 4 of the present invention.

In the printed wiring board 47, a plated layer (e.g., a gold-plated layer) 46 is provided on part of a surface of a printed circuit 42. The plated layer 46 is exposed through an opening 45.

Similarly to the shield printed wiring board 30 illustrated in FIG. 2, the plated layer 46 may be omitted and the printed circuit 42 and the conductive reinforcing plate 15 may be directly connected to each other via an adhesive layer 4 which has flowed into the opening 45.

The conductive reinforcing plate 15 is provided for the printed wiring board with an electronic component mounted thereon, to prevent warpage of the portion where the electronic component is mounted due to flexing of the printed wiring board, and damage on the electronic component caused by the warpage. A conductive metal plate, such as a stainless plate, an iron plate, a copper plate, and an aluminum plate, can be used as the conductive reinforcing plate 15. Among them, a stainless plate is more suitable. Even a thin stainless plate provides sufficient strength to support the electronic component.

The thickness of the conductive reinforcing plate 15 is not particularly limited, but preferably in a range between 0.025 mm and 2 mm, and more preferably in a range between 0.1 mm and 0.5 mm. If the thickness of the conductive reinforcing plate 15 is in this range, a circuit board having the conductive reinforcing plate 15 adhering thereto can be easily mounted in a small device, and has sufficient strength to support the electronic component mounted thereon. A surface of the conductive reinforcing plate 15 may be plated with a layer of metal such as Ni and Au. The conductive reinforcing plate 15 may undergo sandblasting, etching, and other techniques to form projections and recesses on a surface thereof.

Examples of the electronic component used herein include a connector and an IC, and also a chip component such as a resistor and a capacitor.

Now, a method for forming the shield printed wiring board 32 will be described. First, a conductive adhesive film, which will be the conductive adhesive layer 4, is placed on the conductive reinforcing plate 15. The conductive adhesive film is pressed and heated by a press machine, thereby obtaining a conductive adhesive film with a reinforcing plate. Next, the conductive adhesive film with a reinforcing plate is placed on the printed wiring board 47, and pressed and heated by the press machine. Part of the adhesive layer 4 which has been softened by the heat flows into the opening 45 due to the pressure applied. As a result, the conductive reinforcing plate 15 adheres to the printed wiring board 47 via the adhesive layer 4. In addition, the conductive reinforcing plate 15 and the printed circuit 42 of the printed wiring board 47 are connected to each other via a conductive adhesive, and are brought into a conductive state. Thus, the conductive reinforcing plate 15 can perform as electromagnetic wave shielding.

A flexible wiring board which repeatedly undergoes flexing can be a typical example of an object to which a conductive adhesive film made of the conductive adhesive composition of the present invention can be adhered. Needless to say, a rigid printed wiring board can also be such an object. Moreover, the conductive adhesive film made of the conductive adhesive composition of the present invention can be applied not only to a one-side shield wiring board, but also to a both-side shield wiring board.

EXAMPLE

Examples of the present invention will be described below. Note that the present invention is not limited to the Examples. These Examples can be modified and changed within the intent of the present invention. The modifications and changes are included in a scope of the present invention.

Examples 1 to 6 and Comparative Examples 1 to 5

<Formation of Conductive Adhesive Film>
Conductive adhesive films of Examples 1 to 6 and Comparative Examples 1 to 5 having compositions (% by mass) shown in Table 1 were formed according to the following methods.

Materials shown in Table 1 were mixed together to form a conductive adhesive composition in a paste form. A mixture of 35 parts by mass of a polyurethane polyurea resin having an acid value of 2 and 45 parts by mass of a polyurethane polyurea resin having an acid value of 26 was used as the thermosetting resin having a functional group reactive with an epoxy group. As the epoxy resin, 20 parts by mass of a phenoxy-type epoxy resin (trade name: jER4275 manufactured by Mitsubishi Chemical Corporation), 20 parts by mass of phenol novolac epoxy resin (trade name: jER152 manufactured by Mitsubishi Chemical Corporation), and 5 parts by mass of a rubber-modified epoxy resin (trade name: ERP-4030 manufactured by Asahi Denka) were used. As the blocked isocyanate curing agent, DURANATE 17B-60PX (manufactured by Asahi Kasei Chemicals Corporation) was used. As the imidazole-based curing promoter, 2MA-OK (manufactured by SHIKOKU CHEMICALS CORPORATION) was used. As the urethane resin particles, urethane beads (trade name: DAIMICBEAZ manufactured by Dainichiseika Color & Chemicals Mfg. Co., Ltd.) were used. As silica particles, SYLYSIA 360 (having a mean particle diameter of 5 µm manufactured by Fuji Silysia Chemical, Ltd.) were used.

Then, the obtained conductive adhesive composition was applied, by hand coating using a doctor blade (a flat blade), to a polyethylene terephthalate film (a separate film) which has undergone a releasing treatment, and was dried for 3 minutes at 100° C., thereby forming a conductive adhesive film. The doctor blade was appropriately chosen from 1 mil to 5 mil doctor blades (1 mil is equal to 1/1000 inches, that is, 25.4 µm) according to the thickness of the conductive adhesive film to be formed. In the Examples and the Comparative Examples, the conductive adhesive films were formed to have a predetermined thickness as shown in Table 1. The thickness of the conductive adhesive film was measured by a micrometer.

Example 7

Materials shown in Table 1 were mixed together to form a conductive adhesive composition in a paste form. Note that 83 parts by mass of carboxyl group-modified polyester resin (the number average molecular weight: 15000, Tg: 15° C.) having an acid value of 12 mgKOH/g were used as the thermosetting resin. As the epoxy resin, 7 parts by mass of cresol novolac epoxy resin (an epoxy equivalent: 220 g/eq, Tg: 90° C.) were used. As the urethane resin particles, 10 parts by mass of urethane beads having a mean particle diameter of 7 µm and a hardness of 74 were used.

Then, a conductive adhesive film was formed in a similar manner to Example 1.

Examples 8 to 13

Conductive adhesive compositions in a paste form and conductive adhesive films were formed in a similar manner to Example 7 except that the acid value and the content of the carboxyl group-modified polyamide resin, the content of the epoxy resin, and the hardness of the urethane resin particles were changed as shown in Table 2.

Comparative Example 6

A conductive adhesive composition in a paste form and a conductive adhesive film were formed in a similar manner to Example 7 except that silica particles having a mean particle diameter of 4 µm (trade name: SYLYSIA 350 manufactured by Fuji Silysia Chemical, Ltd.) were used instead of urethane resin particles.

Comparative Example 7

A conductive adhesive composition in a paste form and a conductive adhesive film were formed in a similar manner to Example 7 except that the acid value and the content of the carboxyl group-modified polyester resin and the content of the epoxy resin were changed as shown in Table 2, and that no urethane resin was used.

Example 14

Materials shown in Table 3 were mixed together to form a conductive adhesive composition in a paste form. Note that 71 parts by mass of a carboxyl group-modified polyamide resin (the number average molecular weight: 2000, Tg: 30° C.) having an acid value of 18 mgKOH/g were used as the thermosetting resin. As the epoxy resin, 10 parts by mass of a mixed resin, in which a cresol novolac epoxy resin (in a liquid form at room temperature, equivalent: 180 g/eq)/bisphenol A epoxy resin (in a liquid form at room temperature, equivalent: 250 g/eq) is equal to 90/10%, were used. As the urethane resin particles, 19 parts by mass of urethane beads having a mean particle diameter of 7 μm and a hardness of 58 were used.

Then, a conductive adhesive film was formed in a similar manner to Example 1.

Examples 15 and 16

Conductive adhesive compositions in a paste form and conductive adhesive films were formed in a similar manner to Example 14 except that the mean particle diameter and hardness of the urethane resin particles were changed as shown in Table 3.

Comparative Example 8

A conductive adhesive composition in a paste form and a conductive adhesive film were formed in a similar manner to Example 14 except that the content of the carboxyl group-modified polyamide resin and the content of the mixed resin of cresol novolac epoxy resin and bisphenol A epoxy resin were changed as shown in Table 3, and that no urethane resin particles were used.

Comparative Example 9

A conductive adhesive composition in a paste form and a conductive adhesive film were formed in a similar manner to Example 14 except that silica particles having a mean particle diameter of 4 μm (trade name: SYLYSIA 350 manufactured by Fuji Silysia Chemical, Ltd.) were used instead of urethane resin particles.

TABLE 1

| | Polyurethane | | Blocked | Imidazole-based | Urethane Resin Particle | | | | Conductive Particle | | Conductive |
|---|---|---|---|---|---|---|---|---|---|---|---|
| | Polyurea Resin Content [mass %] | Epoxy Resin Content [mass %] | Isocyanate Curing Agent Content [mass %] | Curing Promoter Content [mass %] | Content [mass %] | Mean Particle Diameter [μm] | Hardness [—] | Silica Particle Content [mass %] | Content [mass %] | Mean Particle Diameter [μm] | Adhesive Film Thickness [μm] |
| Example 1 | 49 | 40 | 1 | 0.01 | 10 | 5 | 74 | — | 150 | 15 | 60 |
| Example 2 | 49 | 40 | 1 | 0.01 | 10 | 7 | 74 | — | 150 | 15 | 60 |
| Example 3 | 49 | 40 | 1 | 0.01 | 10 | 7 | 58 | — | 150 | 15 | 60 |
| Example 4 | 49 | 40 | 1 | 0.01 | 10 | 7 | 70 | — | 150 | 15 | 60 |
| Example 5 | 49 | 40 | 1 | 0.01 | 10 | 7 | 85 | — | 150 | 15 | 60 |
| Example 6 | 49 | 40 | 1 | 0.01 | 20 | 7 | 58 | — | 150 | 15 | 60 |
| Comparative Example 1 | 49 | 40 | 1 | 0.01 | 10 | 3 | 74 | — | 150 | 15 | 60 |
| Comparative Example 2 | 49 | 40 | 1 | 0.01 | 10 | 15 | 74 | — | 150 | 15 | 60 |
| Comparative Example 3 | 49 | 40 | 1 | 0.01 | 10 | 7 | 95 | — | 150 | 15 | 60 |
| Comparative Example 4 | 49 | 40 | 1 | 0.01 | — | — | — | 10 | 150 | 15 | 60 |
| Comparative Example 5 | 49 | 40 | 1 | 0.01 | — | — | — | — | 150 | 15 | 60 |

TABLE 2

| | Polyester Resin | | Epoxy Resin Content [mass %] | Blocked Isocyanate Curing Agent Content [mass %] | Imidazole-based Curing Promoter Content [mass %] | Urethane Resin Particle | | | Silica Particle Content [mass %] | Conductive Particle | | Conductive Adhesive Film Thickness [μm] |
|---|---|---|---|---|---|---|---|---|---|---|---|---|
| | Content [mass %] | Acid Value [mg KOH/g] | | | | Content [mass %] | Mean Particle Diameter [μm] | Hardness [—] | | Content [mass %] | Mean Particle Diameter [μm] | |
| Example 7 | 83 | 12 | 7 | — | — | 10 | 7 | 74 | — | 150 | 15 | 60 |
| Example 8 | 78 | 5 | 12 | — | — | 10 | 7 | 74 | — | 150 | 15 | 60 |
| Example 9 | 78 | 5 | 12 | — | — | 10 | 7 | 58 | — | 150 | 15 | 60 |
| Example 10 | 78 | 5 | 12 | — | — | 10 | 7 | 85 | — | 150 | 15 | 60 |
| Example 11 | 78 | 12 | 12 | — | — | 10 | 7 | 74 | — | 150 | 15 | 60 |
| Example 12 | 78 | 12 | 12 | — | — | 10 | 7 | 70 | — | 150 | 15 | 60 |

TABLE 2-continued

|  | Polyester Resin | | Blocked Isocyanate | Imidazole-based | Urethane Resin Particle | | | | Conductive Particle | | Conductive |
|---|---|---|---|---|---|---|---|---|---|---|---|
|  | Content [mass %] | Acid Value [mg KOH/g] | Epoxy Resin Content [mass %] | Curing Agent Content [mass %] | Curing Promoter Content [mass %] | Content [mass %] | Mean Particle Diameter [μm] | Hardness [—] | Silica Particle Content [mass %] | Content [mass %] | Mean Particle Diameter [μm] | Adhesive Film Thickness [μm] |
| Example 13 | 78 | 12 | 12 | — | — | 10 | 7 | 85 | — | 150 | 15 | 60 |
| Comparative Example 6 | 83 | 12 | 7 | — | — | — | — | — | 10 | 150 | 15 | 60 |
| Comparative Example 7 | 87 | 5 | 13 | — | — | — | — | — | — | 150 | 15 | 60 |

TABLE 3

|  | Polyamide Resin | | Blocked Isocyanate | Imidazole-based | Urethane Resin Particle | | | | Conductive Particle | | Conductive |
|---|---|---|---|---|---|---|---|---|---|---|---|
|  | Content [mass %] | Acid Value [mg KOH/g] | Epoxy Resin Content [mass %] | Curing Agent Content [mass %] | Curing Promoter Content [mass %] | Content [mass %] | Mean Particle Diameter [μm] | Hardness [—] | Silica Particle Content [mass %] | Content [mass %] | Mean Particle Diameter [μm] | Adhesive Film Thickness [μm] |
| Example 14 | 71 | 18 | 10 | — | — | 19 | 7 | 58 | — | 150 | 15 | 60 |
| Example 15 | 71 | 18 | 10 | — | — | 19 | 7 | 74 | — | 150 | 15 | 60 |
| Example 16 | 71 | 18 | 10 | — | — | 19 | 5 | 74 | — | 150 | 15 | 60 |
| Comparative Example 8 | 87 | 18 | 13 | — | — | — | — | — | — | 150 | 15 | 60 |
| Comparative Example 9 | 71 | 18 | 10 | — | — | — | — | — | 19 | 150 | 15 | 60 |

<Measurement of Peel Strength>
Then, a 90-degree peeling test was performed to measure the adhesiveness between a gold-plated layer formed on a surface of a copper foil of a copper clad laminate and the conductive adhesive. More specifically, each of the conductive adhesive films formed in Examples 1 to 16 and Comparative Examples 1 to 9 and a metal reinforcing plate made of a SUS plate (having a thickness of 200 μm) were heated and pressed by a press machine at a temperature of 170° C. under the pressure of 2 MPa for 3 minutes, and underwent another one-hour heating at 150° C. Then, the separate film was peeled off, thereby obtaining a conductive adhesive film with a metal reinforcing plate.

Next, a gold-plated layer of a copper foil laminate film, which includes a polyimide base substrate, a copper foil formed on a surface of the base substrate, and the gold-plated layer formed on a surface of the copper foil, and a conductive adhesive film with a metal reinforcing plate were adhered to each other under the same conditions as those of the above thermal compression bonding. Thereafter another adhesion process was performed at a temperature of 170° C. under the pressure of 3 MPa for 30 minutes, using a press machine, thereby obtaining a copper foil laminate film with a metal reinforcing plate. Then, the copper foil laminate film underwent peeling at room temperature at a tension speed of 50 mm/min and a peeling angle of 90°, using a tensile tester (trade name: AGS-X50S manufactured by SHIMADZU CORPORATION), to measure a maximum value of the peel strength at the time of breakage. Films having 9.5 N/cm or higher peel strength were evaluated as having good adhesiveness. The results are shown in Table 4 and Table 5.

Figure 5:
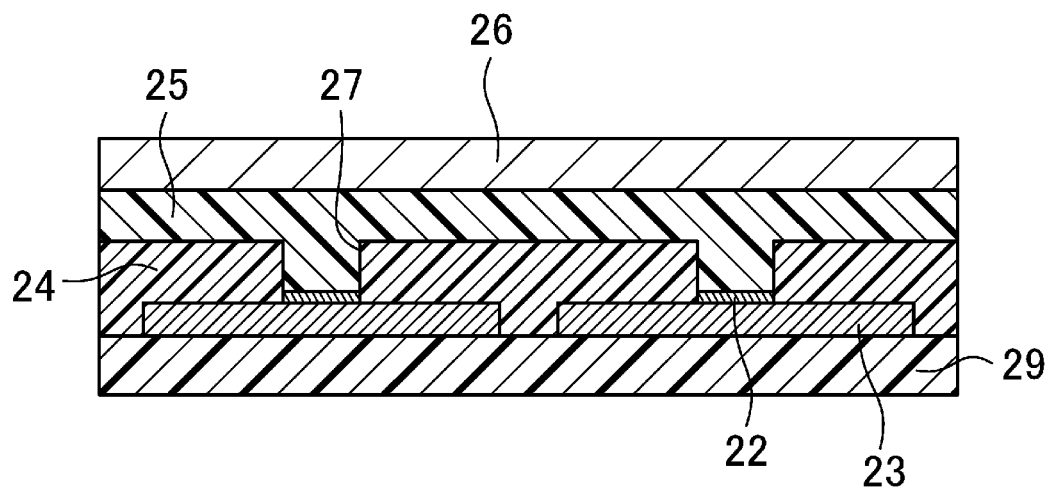
FIG. 5 illustrates a cross-sectional view of a flexible substrate used in Examples.

<Formation of Circuit Board with Metal Reinforcing Plate>
Now, each of the conductive adhesive films (with separate films) formed in Examples 1 to 16 and Comparative Examples 1 to 9 and a metal reinforcing plate (an SUS plate with a Ni-plated surface and a thickness of 200 μm) were heated and pressed by a press machine at a temperature of 120° C. under the pressure of 0.5 MPa for 5 seconds, thereby obtaining a conductive adhesive film with a metal reinforcing plate. Then, the separate film on the conductive adhesive film was peeled off, and the conductive adhesive film with a metal reinforcing plate was adhered to a flexible substrate under the same conditions as those of the above thermal compression bonding. Thereafter another adhesion process was performed at a temperature of 170° C. under the pressure of 3 MPa for 30 minutes, using a press machine, thereby obtaining a circuit board with a metal reinforcing plate. The flexible substrate used herein was formed, as illustrated in FIG. 5, by forming, on a polyimide film 29, a copper foil pattern 23 provided with a gold plated layer 22 on part of a surface of the copper foil pattern 23, and forming thereon a cover lay 24 made of a polyimide film. A conductive adhesive film 25 with a metal reinforcing plate 26 is adhered to this flexible substrate, thereby obtaining a circuit board with a metal reinforcing plate. The cover lay 24 is provided with an opening 27 with a diameter of 0.8 mm to imitate a connecting portion with the ground.

<Measurement of Interconnect Resistance>

Figure 6:
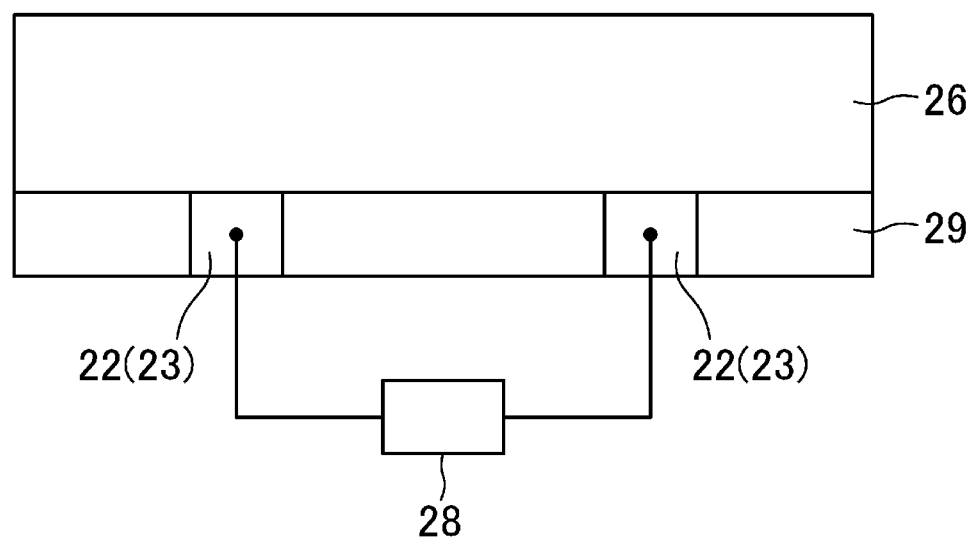
FIG. 6 is a diagram for explaining a method for measuring electrical resistance values in Examples.

Then, the connectivity between the copper foil pattern 23 and the metal reinforcing plate 26 of each of the circuit boards with the metal reinforcing plate formed in Examples 1 to 16 and Comparative Examples 1 to 9 was evaluated by measurement, using a resistance meter, of an interconnect resistance between two rows of the copper foil pattern 23 provided with the gold plated layer 22, as illustrated in FIG. 6. Circuit boards having less than 0.1Ω interconnect resistance were evaluated as having good conductivity. The results are shown in Table 4 and Table 5.

<Evaluation of Reflow Resistance>

Then, reflow resistance of the obtained copper foil films with the metal reinforcing plate (or the obtained circuit boards with the metal reinforcing plate) was evaluated. Bearing a reflow process using lead-free solders in mind, a temperature profile, as a condition for the reflow process, was set such that the polyimide film of the copper foil laminate film with the metal reinforcing plate (or the circuit board with the metal reinforcing plate) was exposed to a temperature of 265° C. for 5 seconds.

Then, the thus obtained copper foil laminate films with the metal reinforcing plate in Examples 1 to 16 and Comparative Examples 1 to 9 were made to pass through a hot-air reflow apparatus three times. Thereafter a maximum value of the peel strength at the time of breakage after the reflow process was measured by the technique described above. Films having 9.5 N/cm or higher peel strength were evaluated as having good adhesiveness after a reflow process. The results are shown in Table 4 and Table 5.

Further, the obtained circuit boards with the metal reinforcing plate in Examples 1 to 16 and Comparative Examples 1 to 9 were made to pass through a hot-air reflow apparatus once, three times, and five times. Thereafter an interconnect resistance after the reflow process was measured by the technique described above. Circuit boards having less than 0.1Ω interconnect resistance were evaluated as having good conductivity after a reflow process. The results are shown in Table 4 and Table 5.

TABLE 4

| | Peel Strength [N/cm] | | Interconnect Resistance [Ω] | | | |
|---|---|---|---|---|---|---|
| | Initial Value | After Reflow (3 times) | Initial Value | After Reflow (Once) | After Reflow (3 times) | After Reflow (5 times) |
| Example 1 | 10.9 | 16.3 | 0.08 | 0.06 | 0.04 | 0.04 |
| Example 2 | 10.2 | 15.9 | 0.06 | 0.07 | 0.05 | 0.03 |
| Example 3 | 11.2 | 19.9 | 0.08 | 0.09 | 0.06 | 0.06 |
| Example 4 | 11.2 | 18.4 | 0.07 | 0.08 | 0.05 | 0.05 |
| Example 5 | 9.7 | 13.9 | 0.05 | 0.05 | 0.03 | 0.03 |
| Example 6 | 10.3 | 14.8 | 0.04 | 0.03 | 0.03 | 0.03 |
| Comparative Example 1 | 11.2 | 18.5 | 0.12 | 0.18 | 0.10 | 0.08 |
| Comparative Example 2 | 9.4 | 15.7 | 0.05 | 0.04 | 0.04 | 0.03 |
| Comparative Example 3 | 8.9 | 15.4 | 0.06 | 0.05 | 0.04 | 0.03 |
| Comparative Example 4 | 7.8 | 11.1 | 0.03 | 0.05 | 0.05 | 0.06 |
| Comparative Example 5 | 10.9 | 15.2 | 0.21 | 0.28 | 0.18 | 0.16 |

TABLE 5

| | Peel Strength [N/cm] | | Interconnect Resistance [Ω] | | | |
|---|---|---|---|---|---|---|
| | Initial Value | After Reflow (3 times) | Initial Value | After Reflow (Once) | After Reflow (3 times) | After Reflow (5 times) |
| Example 7 | 13.0 | 14.0 | 0.07 | 0.06 | 0.05 | 0.04 |
| Example 8 | 13.9 | 16.0 | 0.05 | 0.05 | 0.04 | 0.04 |
| Example 9 | 15.1 | 15.5 | 0.09 | 0.06 | 0.06 | 0.05 |
| Example 10 | 11.4 | 14.0 | 0.09 | 0.08 | 0.07 | 0.07 |
| Example 11 | 13.0 | 13.9 | 0.09 | 0.07 | 0.05 | 0.05 |
| Example 12 | 15.2 | 15.1 | 0.08 | 0.08 | 0.06 | 0.05 |
| Example 13 | 11.2 | 11.9 | 0.09 | 0.09 | 0.08 | 0.07 |
| Example 14 | 17.3 | 15.6 | 0.05 | 0.05 | 0.05 | 0.04 |
| Example 15 | 18.1 | 19.0 | 0.05 | 0.07 | 0.05 | 0.04 |
| Example 16 | 15.6 | 15.2 | 0.07 | 0.07 | 0.06 | 0.05 |
| Comparative Example 6 | 11.0 | 9.0 | 0.12 | 0.11 | 0.10 | 0.08 |
| Comparative Example 7 | 15.6 | 16.2 | 0.60 | 0.60 | 0.55 | 0.55 |
| Comparative Example 8 | 18.9 | 19.1 | 0.23 | 0.34 | 0.35 | 0.41 |
| Comparative Example 9 | 16.3 | 8.7 | 0.06 | 0.07 | 0.06 | 0.05 |

As shown in Table 4 and Table 5, Examples 1 to 16 using the urethane beads having the mean particle diameter of 4 μm or more and 13 μm or less and the hardness of 55 or more and 90 or less have good conductivity and good adhesiveness to the copper foil laminate film before and after the reflow process.

On the other hand, the interconnect resistance is not sufficiently reduced before and after the reflow process in Comparative Example 1 using the urethane beads having a small mean particle diameter (i.e., 3 μm), as well as in Comparative Examples 5, 7 and 8 in which no urethane beads are used.

In Comparative Example 2 using the urethane beads having a large mean particle diameter (i.e., 15 μm) and Comparative Example 3 using the urethane beads with a great value of hardness (i.e., 95), the adhesiveness to the copper foil laminate film (before the reflow process) is not sufficient.

In Comparative Example 4 using silica particles (having a mean particle diameter of 5 μm) instead of the urethane beads, the adhesiveness to the copper foil laminate film (before the reflow process) is not sufficient.

In Comparative Example 6 using silica particles (having a mean particle diameter of 4 μm) instead of the urethane beads, the adhesiveness to the copper foil laminate film (after the reflow process) is not sufficient.

In Comparative Example 9 using silica particles (having a mean particle diameter of 4 μm) instead of the urethane beads, the adhesiveness to the copper foil laminate film (after the reflow process) is not sufficient.

INDUSTRIAL APPLICABILITY

As can be seen from the foregoing description, the present invention is suitable as a conductive adhesive composition used for a printed wiring board.

DESCRIPTION OF REFERENCE CHARACTERS

1 Conductive Adhesive Film
2 Separable Base
4 Conductive Adhesive Layer
13 Protective Layer
14 Metal Layer
15 Conductive Reinforcing Plate
20 Electromagnetic-Wave Shielding Film
21 Electromagnetic-Wave Shielding Film
30 Shield Printed Wiring Board
31 Shield Printed Wiring Board
32 Shield Printed Wiring Board
40 Printed Wiring Board
41 Base Substrate
42 Printed Circuit
43 Insulating Adhesive Layer
44 Cover Lay
45 Opening
46 Plated Layer
47 Printed Wiring Board

The invention claimed is:

1. An electrically conductive adhesive composition containing a thermosetting resin having a functional group reactive with an epoxy group, an epoxy resin, and an electrically conductive filler, wherein
   the electrically conductive adhesive composition further contains urethane resin particles having a mean particle diameter of 4 μm or more and 13 μm or less and a hardness of 55 or more and 90 or less measured by a type A durometer in conformity with JIS K6253.

2. The electrically conductive adhesive composition of claim 1, wherein a content of the urethane resin particles with respect to a total amount of the electrically conductive adhesive composition is between 3% by mass and 30% by mass.

3. The electrically conductive adhesive composition of claim 1, wherein the thermosetting resin is one kind of resin selected from the group consisting of a carboxyl group-modified polyester resin, a carboxyl group-modified polyamide resin, and a carboxyl group-modified polyurethane polyurea resin.

4. An electrically conductive adhesive film comprising a separable base and an electrically conductive adhesive layer made of the electrically conductive adhesive composition of claim 1 provided on a surface of the separable base.

5. An electromagnetic-wave shielding film comprising an insulating protective layer and an electrically conductive adhesive layer made of the electrically conductive adhesive composition of claim 1 provided on a surface of the protective layer.

6. A printed wiring board comprising a base substrate on which a printed circuit is formed, an electrically conductive adhesive layer made of the electrically conductive adhesive composition of claim 1, and an electrically conductive reinforcing plate, wherein
   the base substrate and the electrically conductive reinforcing plate are electrically connected to each other by the electrically conductive adhesive layer.

* * * * *